US009324831B2

(12) United States Patent
Zschätzsch et al.

(10) Patent No.: US 9,324,831 B2
(45) Date of Patent: Apr. 26, 2016

(54) FORMING TRANSISTORS WITHOUT SPACERS AND RESULTING DEVICES (71) Applicant: GLOBALFOUNDRIES Inc., Grand Cayman (KY)

(72) Inventors: Gerd Zschätzsch, Dresden (DE); Stefan Flachowsky, Dresden (DE); Jan Hoentschel, Dresden (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/461,713

(22) Filed: Aug. 18, 2014

(65) Prior Publication Data

US 2016/0049494 A1 Feb. 18, 2016

(51) Int. Cl.
*H01L 21/8238* (2006.01)
*H01L 29/66* (2006.01)
*H01L 29/78* (2006.01)
*H01L 21/02* (2006.01)
*H01L 21/265* (2006.01)

(52) U.S. Cl.
CPC .... *H01L 29/66545* (2013.01); *H01L 21/02381* (2013.01); *H01L 21/02532* (2013.01); *H01L 21/26513* (2013.01); *H01L 29/66515* (2013.01); *H01L 29/78* (2013.01)

(58) Field of Classification Search
CPC .................................................. H01L 29/66545
See application file for complete search history.

(56) References Cited

U.S. PATENT DOCUMENTS

| | | | |
|---|---|---|---|
| 2002/0037619 A1* | 3/2002 | Sugihara et al. | 438/289 |
| 2006/0046399 A1* | 3/2006 | Lindert et al. | 438/282 |
| 2012/0025266 A1* | 2/2012 | Griebenow et al. | 257/190 |
| 2012/0032230 A1* | 2/2012 | Yin et al. | 257/192 |
| 2012/0261754 A1* | 10/2012 | Cheng et al. | 257/347 |
| 2013/0087833 A1* | 4/2013 | Wang | 257/192 |
| 2014/0027854 A1* | 1/2014 | Asenov | 257/348 |
| 2014/0138763 A1* | 5/2014 | Yang et al. | 257/329 |
| 2014/0145242 A1* | 5/2014 | Huang et al. | 257/192 |

\* cited by examiner

*Primary Examiner* — Angel Roman
(74) *Attorney, Agent, or Firm* — Ditthavong & Steiner, P.C.

(57) ABSTRACT

Methods for forming gates without spacers and the resulting devices are disclosed. Embodiments may include forming a channel layer on a substrate; forming a dummy gate on the channel layer; forming an interlayer dielectric (ILD) on the channel layer and surrounding the dummy gate; forming a trench within the ILD and the channel layer by removing the dummy gate and the channel layer below the dummy gate; forming an un-doped channel region at the bottom of the trench; and forming a gate above the un-doped channel region within the trench.

14 Claims, 10 Drawing Sheets

FORMING TRANSISTORS WITHOUT SPACERS AND RESULTING DEVICES

TECHNICAL FIELD

The present disclosure relates to forming field-effect transistors (FETs). The present disclosure is particularly applicable to forming gates of FETs without spacers and the resulting devices, and is particularly applicable to 28 nanometer (nm) technology nodes and beyond.

BACKGROUND

Forming FETs according to gate last or replacement metal gate (RMG) process flows, whether for planar or three-dimensional schemes, involves forming spacers surrounding dummy gates. The spacers cause alignment variations in process flows, which reduces chip yield. Moreover, in process flows that use stress-inducing layers, spacers offset the stress-inducing layers from the channel regions and reduce the beneficial effects of the stress-inducing layers. Such a reduction can be in the form of reduced mobility that would otherwise be caused by the stress-inducing layers, which prohibits drive current improvements. Spacers also cause an offset or gap between the gates and surrounding source/drain regions.

A need, therefore, exists for methodology for forming gates without spacers and the resulting devices.

SUMMARY

An aspect of the present disclosure is a method for forming gates without spacers.

Another aspect of the present disclosure is a device including a gate without spacers.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a channel layer on a substrate; forming a dummy gate on the channel layer; forming an interlayer dielectric (ILD) on the channel layer and surrounding the dummy gate; forming a trench within the ILD and the channel layer by removing the dummy gate and the channel layer below the dummy gate; forming an un-doped channel region at the bottom of the trench; and forming a gate above the un-doped channel region within the trench.

An aspect of the present disclosure includes the ILD being contiguous with the gate. A further aspect includes the substrate having a band gap offset against the channel layer. Another aspect includes the substrate being silicon (Si) and the channel layer being doped-Si. An additional aspect includes forming the doped-Si channel layer by epitaxial growth. Yet another aspect includes forming the doped-Si channel layer by implanting a dopant into the substrate. Still another aspect includes removing a portion of the substrate below the trench after removing the channel layer below the dummy gate; and forming the un-doped channel region in the substrate below the trench and in the channel layer below the dummy gate. A further aspect with respect to forming the gate includes conformally forming a high-k dielectric layer within the trench after forming the un-doped channel region; and filling the trench with a metal. An additional aspect includes the ILD being contiguous with the high-k dielectric layer. Another aspect includes forming contact holes in the ILD on opposite sides of the gate. A further aspect includes forming source/drain contacts within the channel layer below the contact holes.

Another aspect of the present disclosure is a device including: a substrate; a channel layer above the substrate; a trench through the channel layer; an un-doped channel region in the trench, surrounded by the channel layer; a gate above the un-doped channel region; and ILD above the channel layer and surrounding the gate.

Aspects include the ILD being contiguous with the gate. A further aspect includes the substrate having a band gap offset against the channel layer. An additional aspect includes the substrate being Si and the channel layer being epitaxial doped-Si. Still another aspect includes contact holes on opposite sides of the gate extending through the ILD to the channel layer; and source/drain contacts within the channel layer. A further aspect includes a top surface of the un-doped channel region being co-planar with a top surface of the channel layer, and a bottom surface of the un-doped channel region being below a top surface of the substrate.

Another aspect of the present disclosure is a method including: forming a channel layer above a substrate, wherein the substrate has a band gap offset against the channel layer; forming a dummy gate on the channel layer; forming ILD on the channel layer being contiguous with and surrounding the dummy gate; forming a trench within the ILD, the channel layer, and at least part of the substrate by removing the dummy gate, the channel layer below the dummy gate, and a portion of the substrate below the dummy gate; forming an un-doped channel region at the bottom of the trench by epitaxial growth; conformally forming a high-k dielectric layer within the trench after forming the un-doped channel region; and filling the trench with a metal.

Further aspects of the method include forming contact holes in the ILD on opposite sides of the high-k dielectric layer; and forming source/drain contacts within the channel layer below the contact holes. An additional aspect includes forming the channel layer of doped Si and the substrate of Si.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of reductions in chip yield and variations attendant upon gate-last process flows involving spacers surrounding the gates. In accordance with embodiments of the present disclosure, gates are formed without spacers.

Methodology in accordance with an embodiment of the present disclosure includes forming a channel layer on a substrate, followed by a dummy gate on the channel layer. Next, ILD is formed on the channel layer surrounding the dummy gate. A trench is then formed within the ILD and the channel layer by removing the dummy gate and the channel layer below the dummy gate. An un-doped channel region is formed at the bottom of the trench followed by forming a gate above the un-doped channel region filling the trench. As will be understood from the disclosure and accompanying drawings, the disclosed methodology can be implemented in the formation of planar and three-dimensional transistors, e.g., fin field-effect transistor (FinFET) and/or multi-gate transistors.

Figure 1:
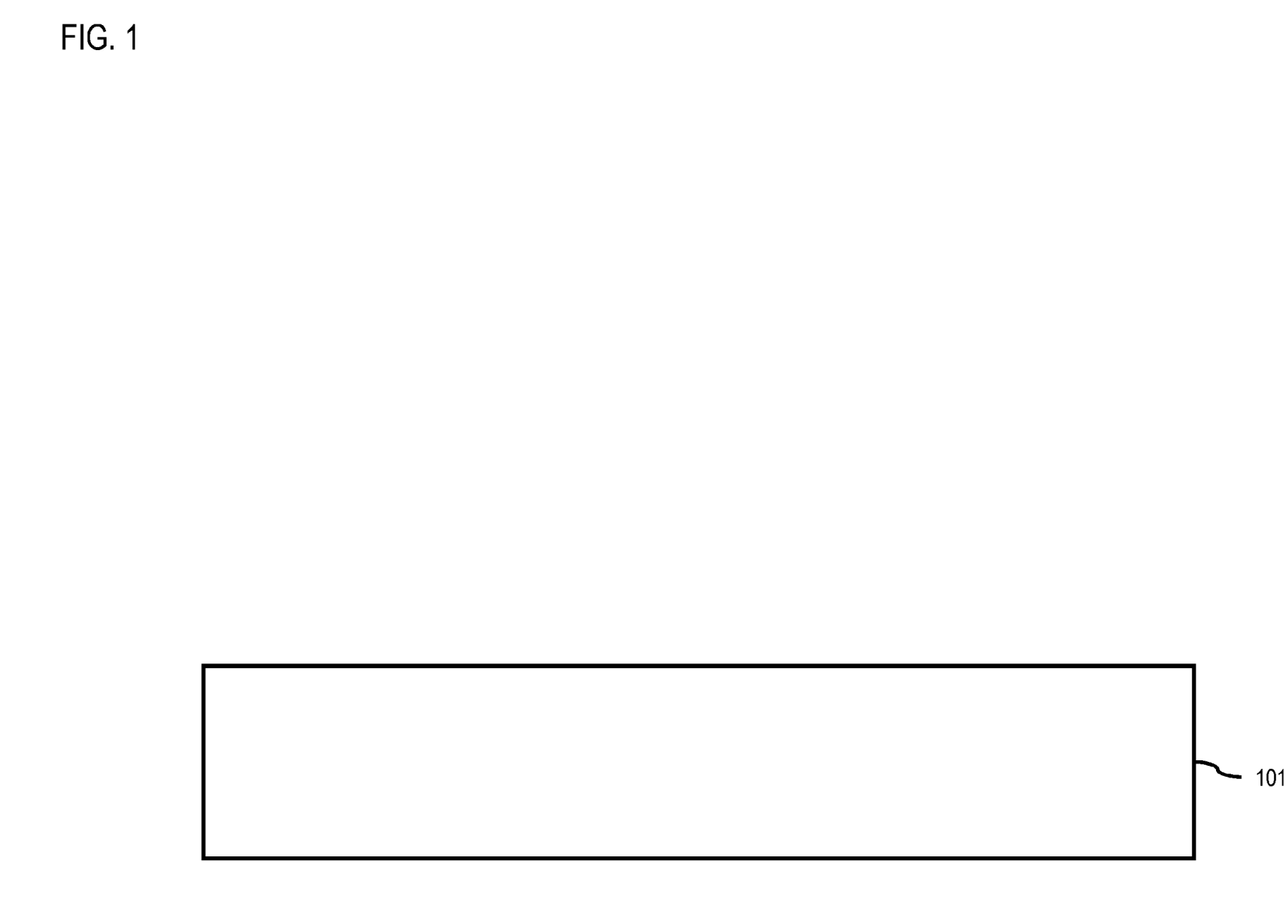
FIGS. 1 through 10 schematically illustrate a method for forming gates without spacers, in accordance with an exemplary embodiment.

Adverting to FIG. 1, a method for forming a gate without spacers in a gate-last process flow, according to an exemplary embodiment, begins with a substrate 101. The substrate 101 may be a bulk Si substrate. Alternatively, the substrate 101 may be an elementary semiconductor, such as Si or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates also include a silicon-on-insulator (SOI) substrate. The substrate 101 may be intended for planar or three-dimensional transistors, such as FinFETs.

Figure 2:
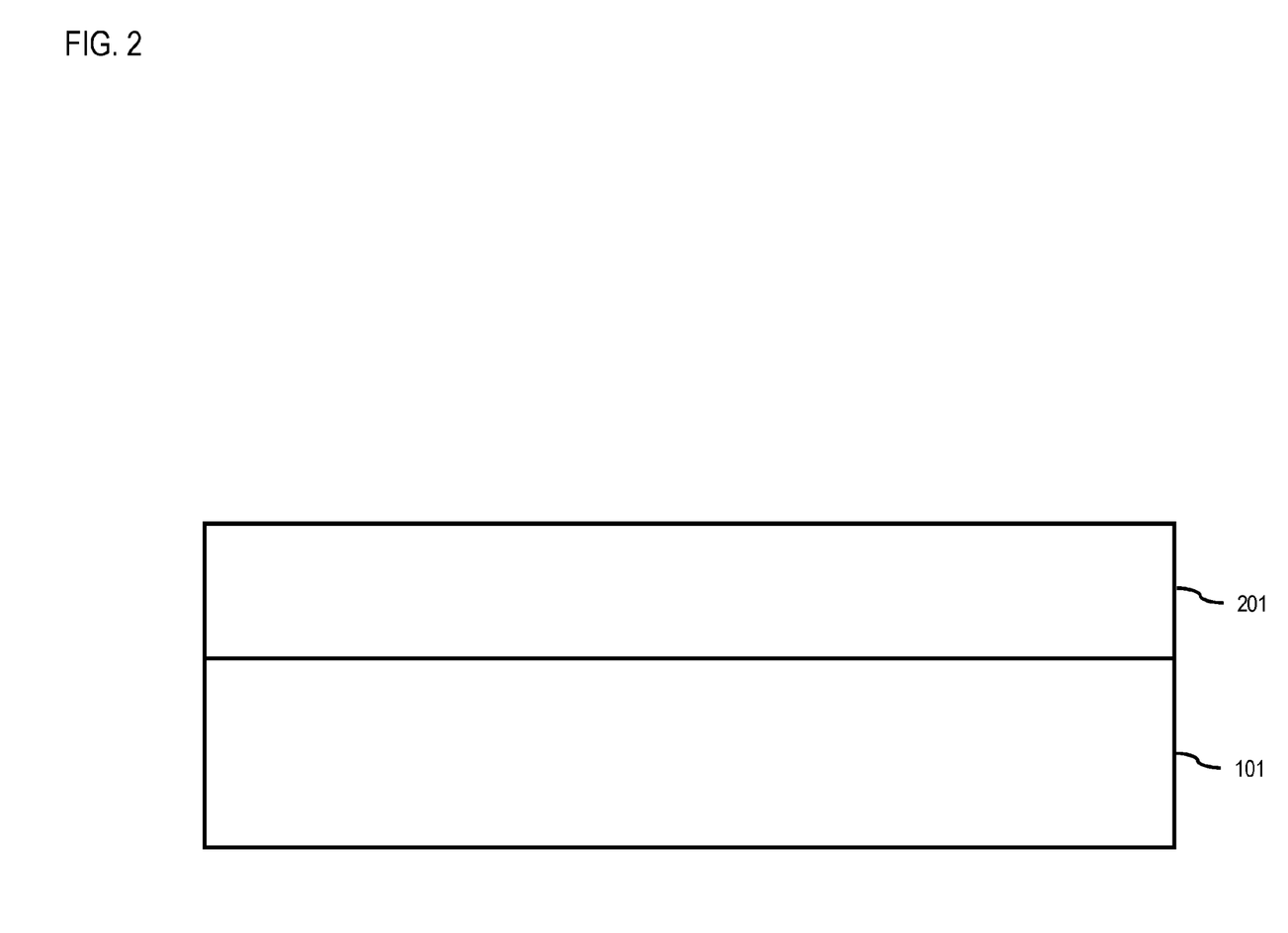

Next, a channel layer 201 is formed on the substrate 101, as illustrated in FIG. 2. When the substrate 101 is Si, the channel layer 201 may be formed of doped Si. However, the material selected for the substrate 101 is such that there exists a band gap offset for the substrate 101 against the channel layer 201 for leakage reduction and/or mobility improvement. Accordingly, the substrate 101 may be Si and the channel layer may be SiGe.

The channel layer 201 can be formed by epitaxial growth to include all desired dopants within the resulting device and to reduce fluctuations within the channel layer 201. For example, SiGe may be grown on all exposed areas of the substrate 101 to form the channel layer 201. Alternatively, however, the channel layer 201 may be formed by implantation of a dopant in the top surface of the substrate 101.

Figure 3:
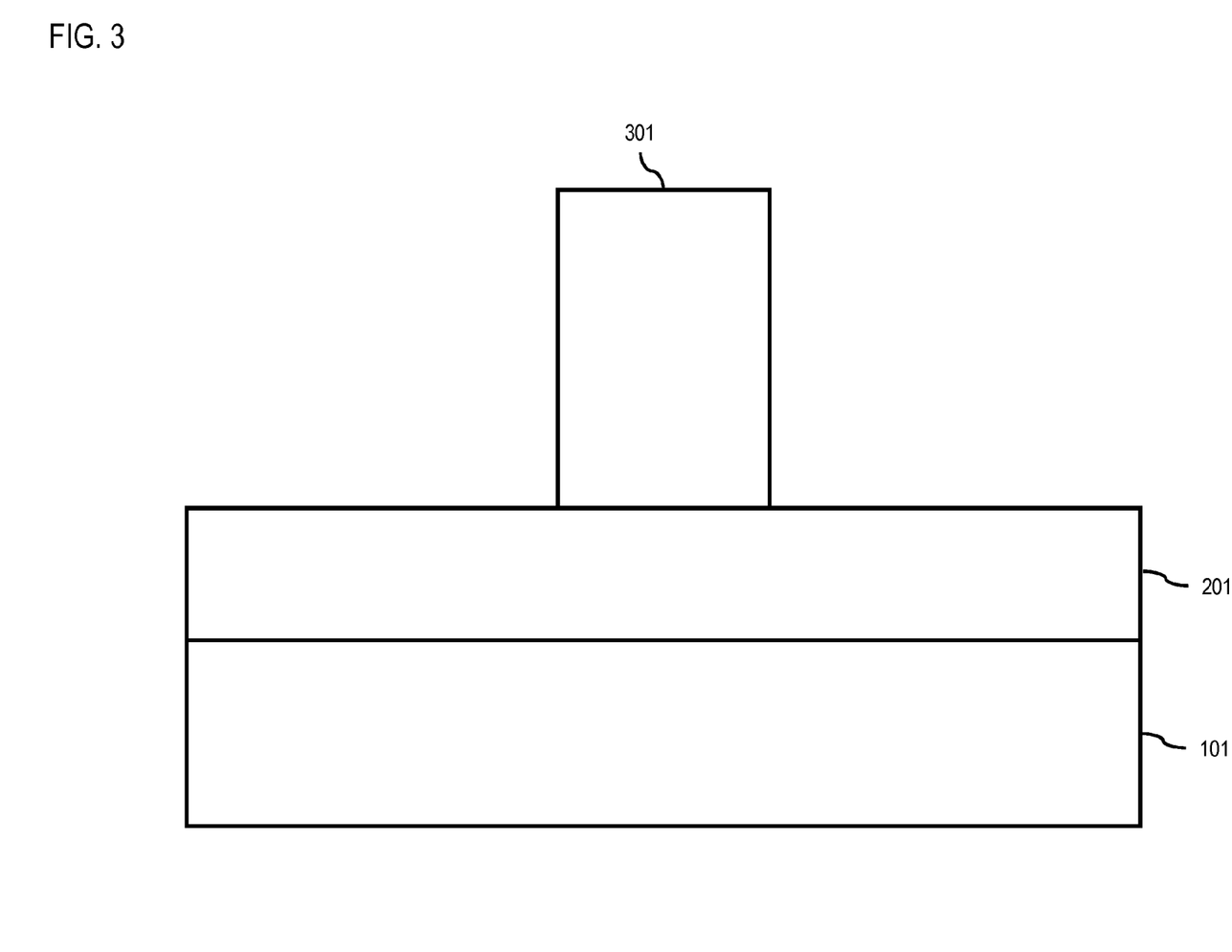
Figure 4:
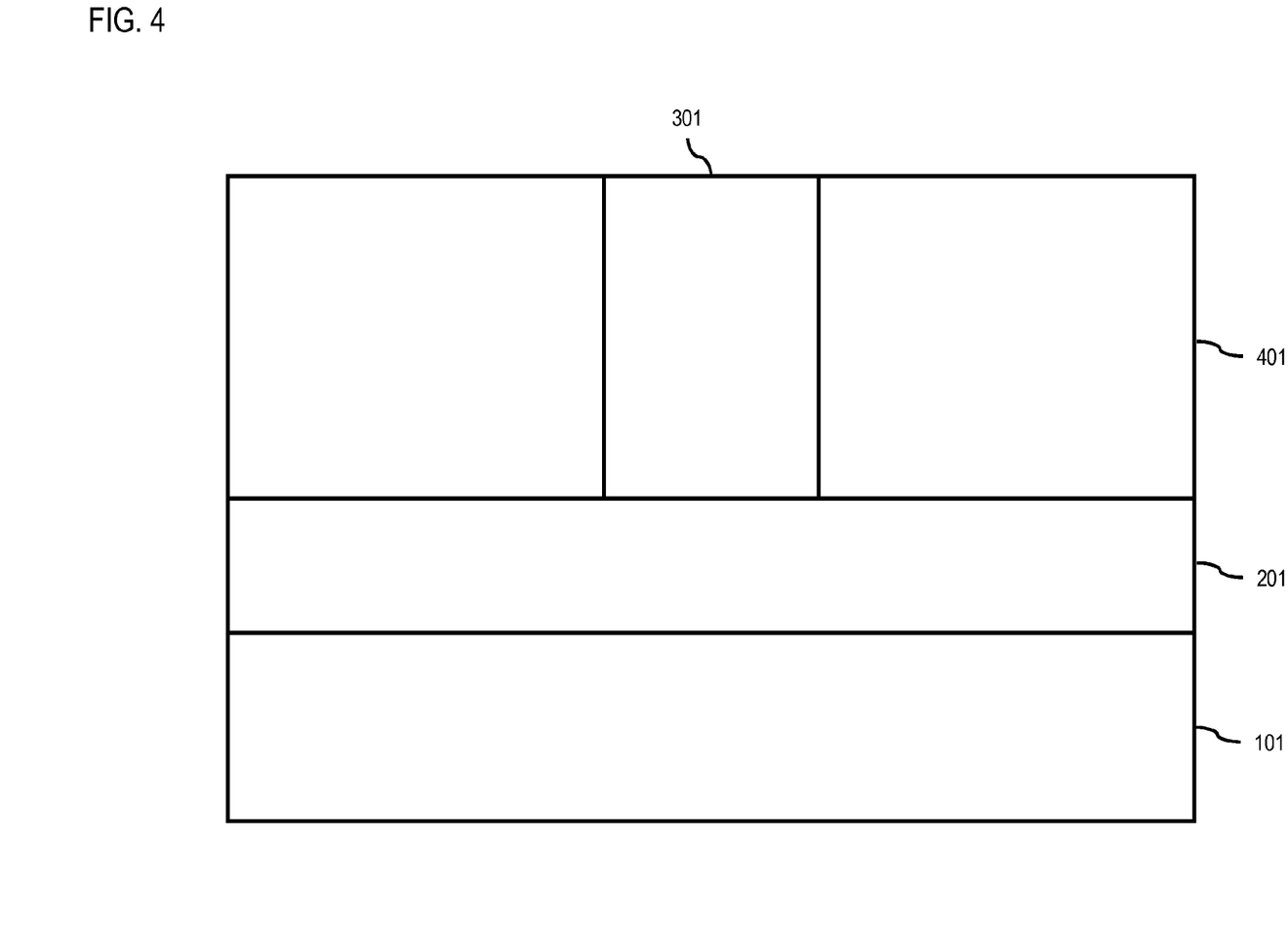

Adverting to FIG. 3, a dummy gate 301 is formed on the channel layer 201. The dummy gate 301 can be formed of any suitable material, such as poly-silicon (poly-Si), and can be formed according to any suitable process. ILD 401 is then formed surrounding the dummy gate 301 on the channel layer 201, as illustrated in FIG. 4. Because there are no spacers surrounding the dummy gate 301, the ILD 401 is formed contiguous to the dummy gate 301. The ILD 401 can be any suitable insulator material, such as silicon dioxide ($SiO_2$). In forming the ILD 401, chemical mechanical polishing (CMP) may be used to remove any top layer of the ILD 401 and to expose the dummy gate 301.

Figure 5:
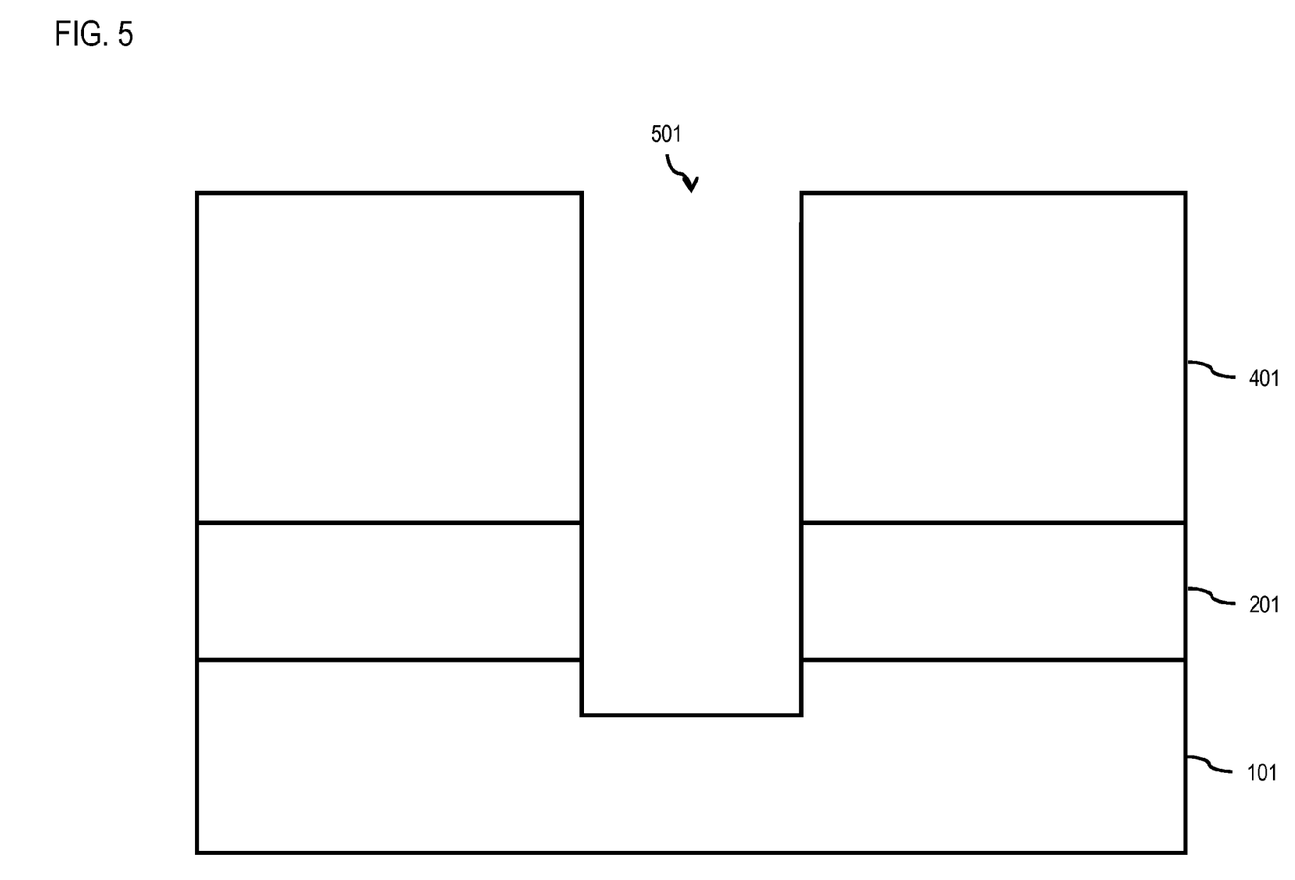

Adverting to FIG. 5, a trench 501 is formed. As illustrated, the trench 501 is formed by removing the dummy gate 301, and the portion of the channel layer 201 below the dummy gate 301. Further, to ensure that the entire channel layer 201 is removed in forming the trench 501, a portion of the substrate 101 may also be removed such that the bottom of the trench 501 is below the top surface of the substrate 101. However, it is not necessary to remove such a portion of the substrate 101 as long as the channel layer 201 is completely removed to prevent leakage. The trench 501 can be formed according to any suitable process, such as by etching.

Figure 6:
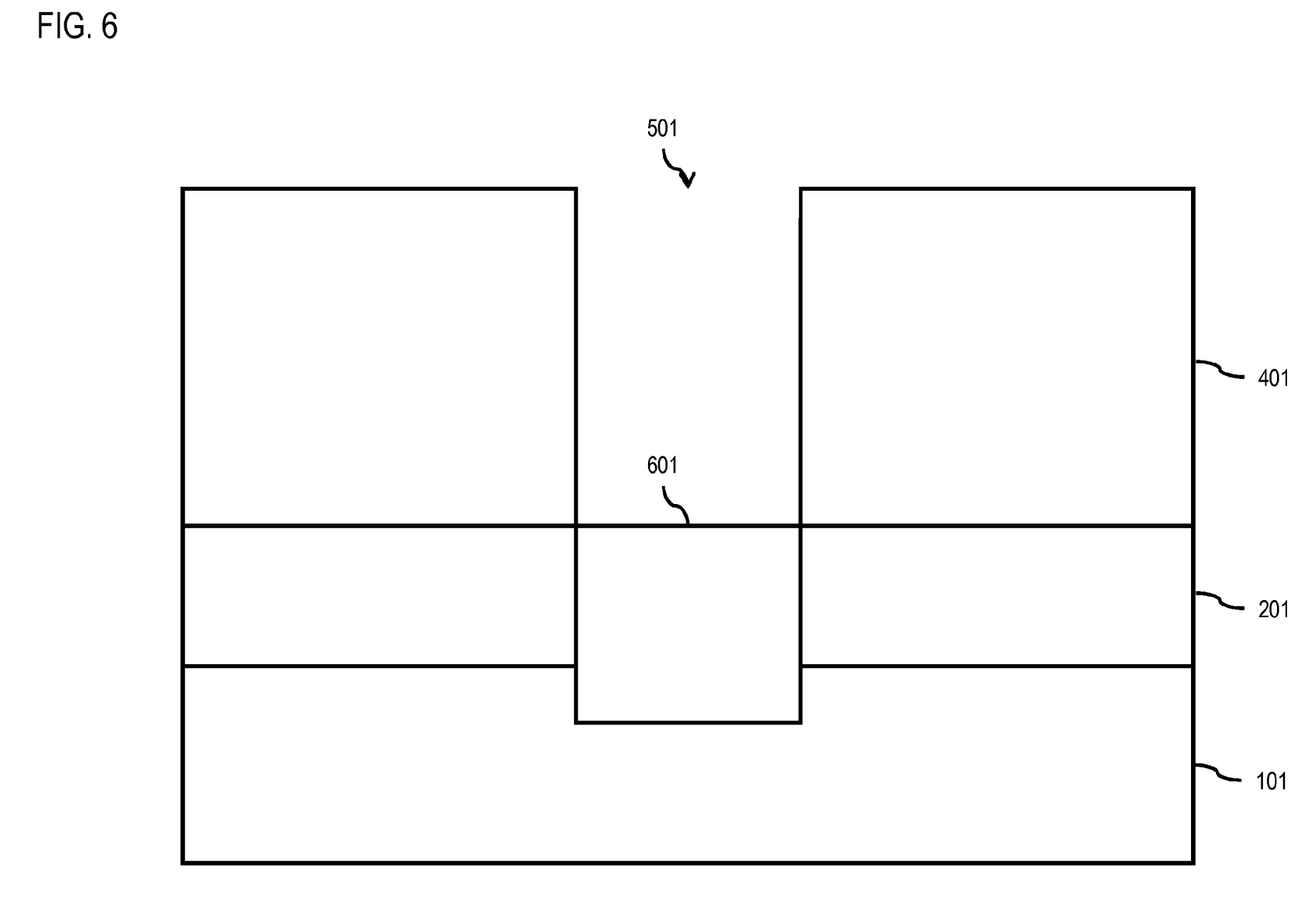

After forming the trench 501, an un-doped channel region 601 is formed at the bottom of the trench 501, as illustrated in FIG. 6. The un-doped channel region 601 may be formed by epitaxial growth and may be formed of Si. Because the un-doped channel region 601 is free of a dopant, the un-doped channel region 601 has increased mobility because of the absence of scatter centers. The un-doped channel region 601 can be formed of alternative materials depending on the materials used in forming the channel layer 201 and the substrate 101. As illustrated, the bottom of the un-doped channel region 601 is formed below the top surface of the substrate 101 when a portion of the substrate 101 is removed during formation of the trench 501. However, the bottom of the un-doped channel region 601 may be formed level with the top surface of the substrate 101 if no substrate 101 is removed in forming the trench 501. Further, the top surface of the un-doped channel region 601 is formed level with the top surface of the channel layer 201.

Figure 7:
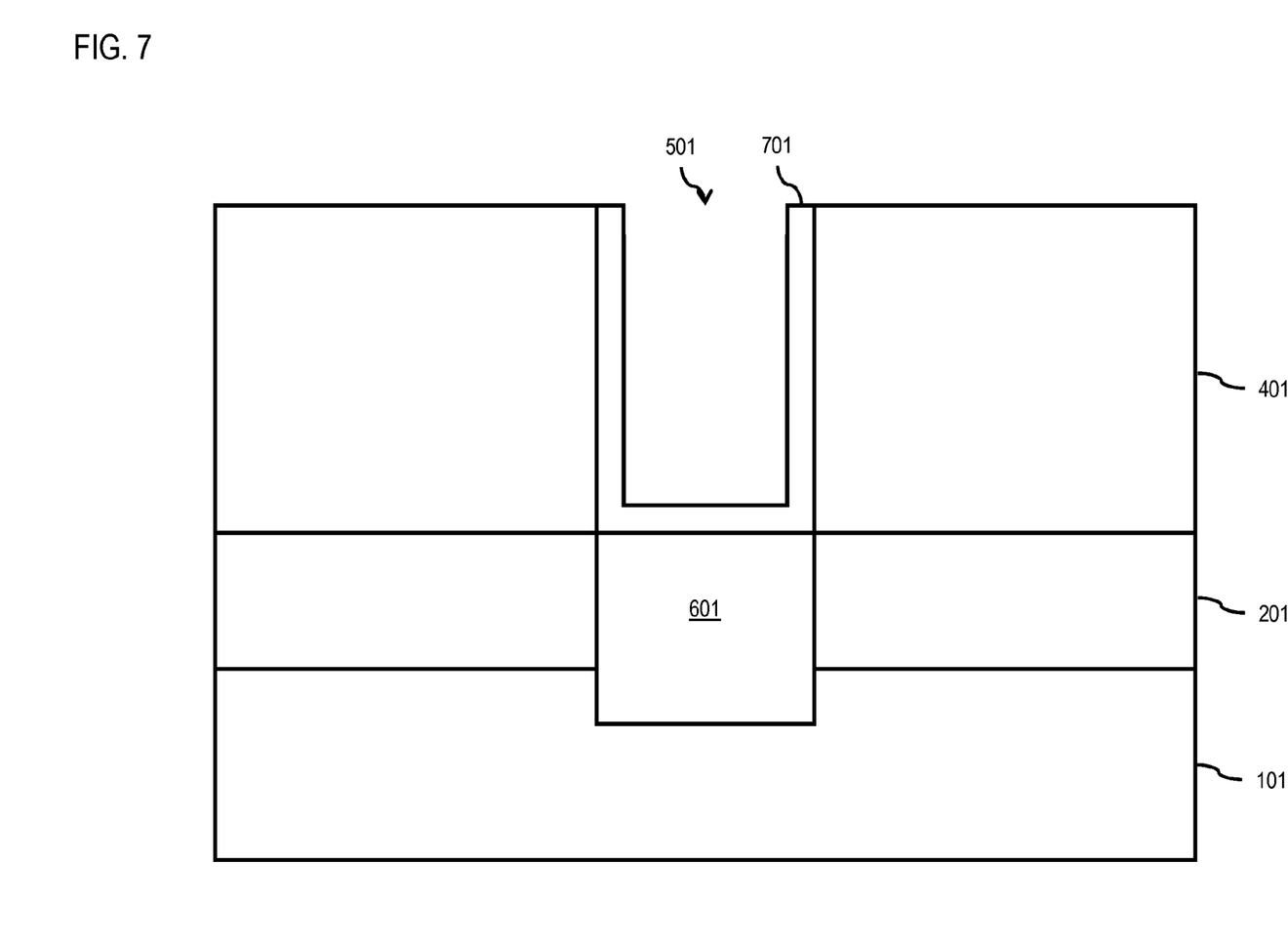

Adverting to FIG. 7, a high-k dielectric layer 701 is conformally formed within the trench 501 above the un-doped channel region 601. The conformal high-k dielectric layer 701 can be formed of any suitable high-k dielectric material to any suitable thickness. Because there are no spacers surrounding the trench 501 prior to forming the conformal high-k dielectric layer 701, the conformal high-k dielectric layer 701 is formed contiguous to the ILD 401.

Figure 8:
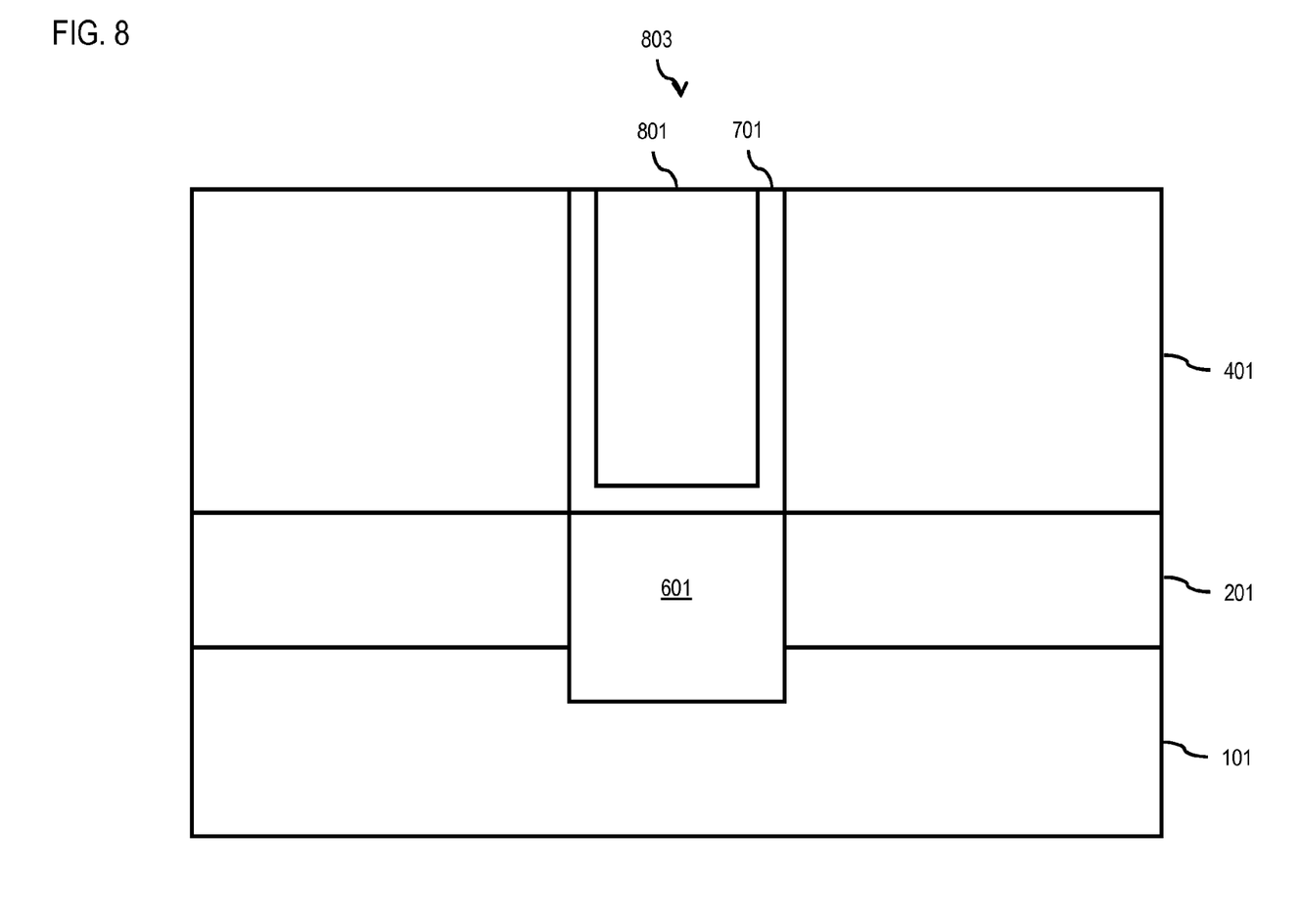

After forming the conformal high-k dielectric layer 701, the remainder of the trench 501 is filled with a metal 801, as illustrated in FIG. 8. The metal 801 can be any suitable metal fill for forming a FET. The conformal high-k dielectric layer 701 and the metal 801 can be formed according to a conventional RMG process flow. The conformal high-k dielectric layer 701 and the metal 801 form a gate 803 above the un-doped channel region 601 surrounded by the ILD 401.

Figure 9:
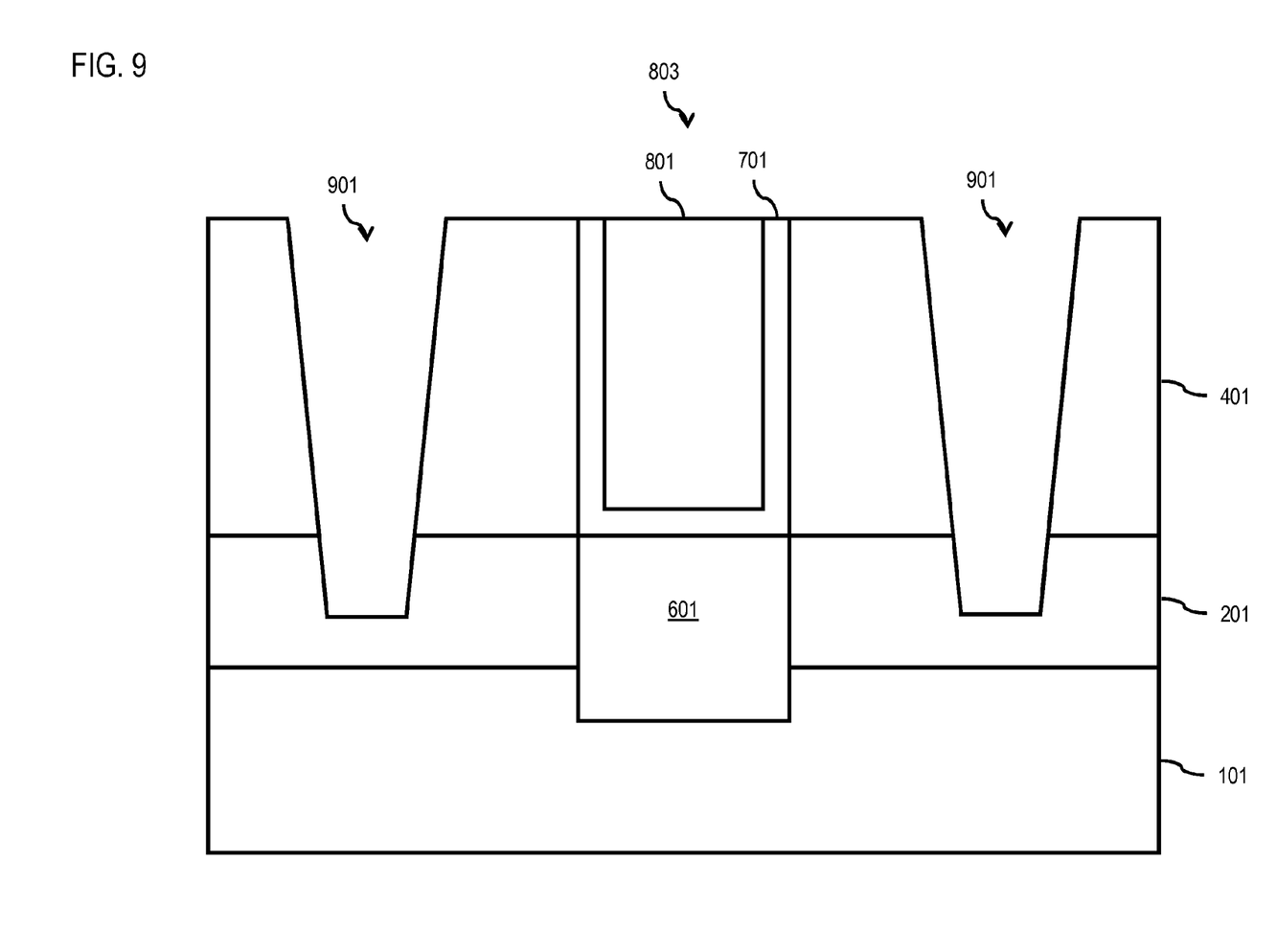

Because the channel layer 201 is already doped, implantation and/or doping of the channel layer 201 to form source/drain regions after forming the gate 803 is not necessary. Further, by not having spacers on opposite sides of the gate 803, and by having the un-doped channel region 601 and the gate 803 contiguous to the channel layer 201 and the ILD 401, respectively, the un-doped channel region 601 and the gate 803 define source/drain regions within the channel layer 201. Accordingly, contact holes 901 are formed on opposite sides of the gate 803, as illustrated in FIG. 9. The contact holes 901 can be formed by etching the ILD 401. The contact holes 901 may further extend into the channel layer 201, as illustrated. Because there are no spacers surrounding the gate 803, formation of the contact holes 901 is lithography based rather than according to a self-aligned process.

Figure 10:
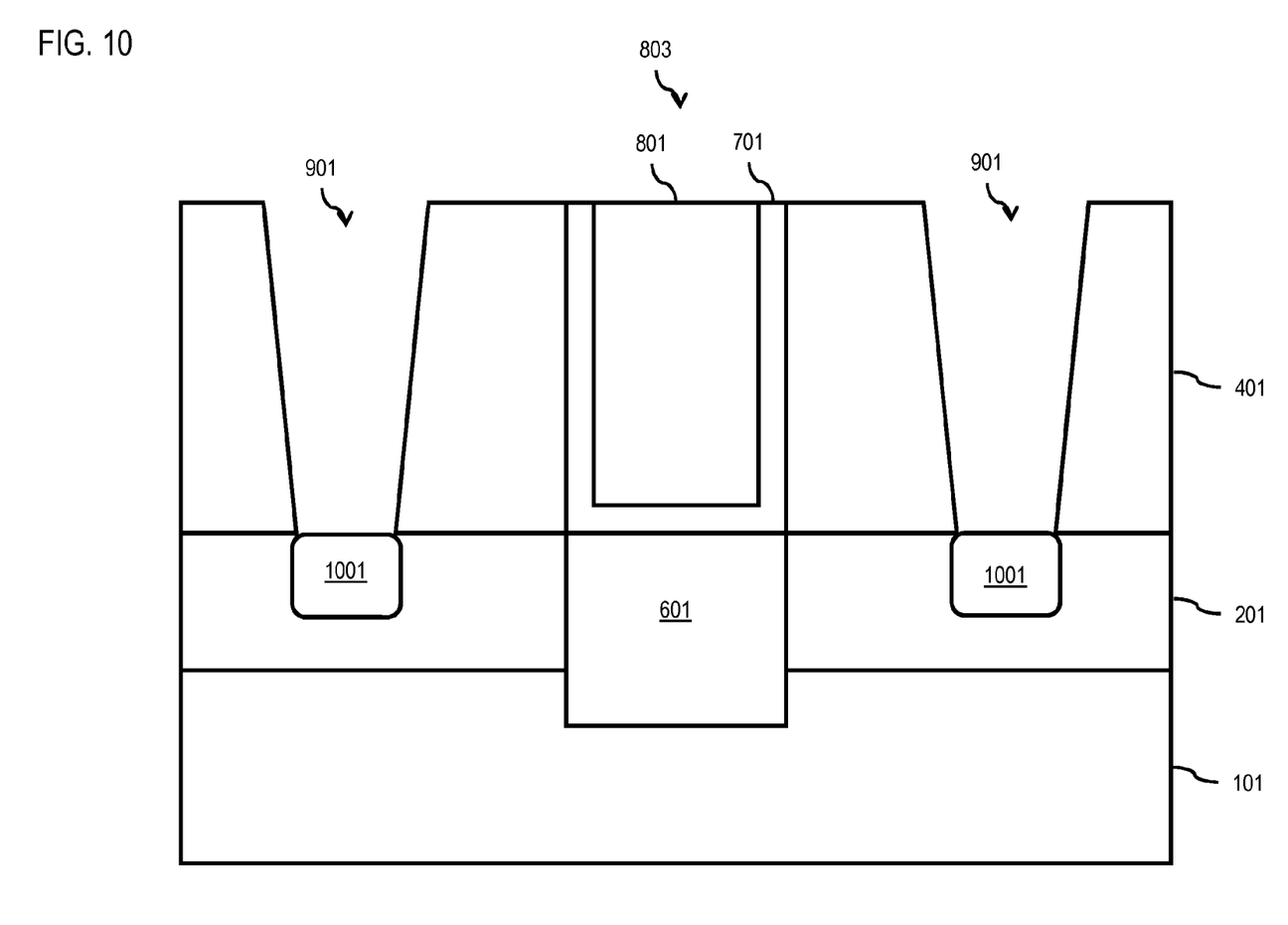

Upon forming the contact holes 901, silicide regions 1001 are formed, as illustrated in FIG. 10. The silicide regions 1001 serve as contact regions for the source/drains. After formation of the silicide regions 1001, the process flow continues with a conventional back-end-of-line (BEOL) process flow, which may include filling the contact holes 901 to form vertical interconnect accesses (VIAs) according to conventional processing.

The embodiments of the present disclosure achieve several technical effects, including improved chip yield because of reduced variations normally caused by forming spacers and implants, and reduced cycle time and time-to-market. Integrated with process flows that include a stress layer, the present disclosure achieves the technical effect of improved mobility and drive current improvements because of the proximity of the stress layer to the channel of the gate without intervening spacers intervening. Further, the embodiments of the present disclosure achieve the technical effect of ease of process integration because no spacers are needed, no implants are needed, such as for halo regions, extension regions, and/or source/drain regions, and, therefore, no final activation anneal is needed because of the in-situ activation of the epitaxial grown materials, which avoids damaging the substrate. The present disclosure enjoys industrial applicability associated with the designing and manufacturing of any of various types of highly integrated semiconductor devices used in microprocessors, smart phones, mobile phones, cellular handsets, set-top boxes, DVD recorders and players, automotive navigation, printers and peripherals, networking and telecom equipment, gaming systems, and digital cameras, particularly for 28 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a channel layer on a substrate;
   forming a dummy gate on the channel layer;
   forming an interlayer dielectric (ILD) on the channel layer and surrounding the dummy gate;
   forming a trench within the ILD and the channel layer by removing the dummy gate and the channel layer below the dummy gate;
   forming an un-doped channel region at the bottom of the trench;
   conformally forming a high-k dielectric layer within the trench after forming the un-doped channel region;
   filling the trench with a metal to form a gate above the un-doped channel region;
   removing a portion of the substrate below the trench after removing the channel layer below the dummy gate; and
   forming the un-doped channel region in the substrate below the trench and in the channel layer below the dummy gate
   wherein the gate does not include spacers and the ILD is in direct contact with the high-k dielectric layer.

2. The method according to claim 1, wherein the substrate has a band gap offset against the channel layer.

3. The method according to claim 1, wherein the substrate is silicon (Si) and the channel layer is doped-Si.

4. The method according to claim 3, comprising forming the doped-Si channel layer by epitaxial growth.

5. The method according to claim 3, comprising forming the doped-Si channel layer by implanting a dopant into the substrate.

6. The method according to claim 1, further comprising:
   forming contact holes in the ILD on opposite sides of the gate.

7. The method according to claim 6, further comprising:
   forming source/drain contacts within the channel layer below the contact holes.

8. A device comprising:
   a substrate;
   a channel layer above the substrate;
   a trench through the channel layer;
   an un-doped channel region in the trench, surrounded by the channel layer;
   a gate above the un-doped channel region, the gate including a conformal high-k dielectric layer within the trench and a metal filling a remainder of the trench;
   an interlayer dielectric (ILD) above the channel layer and surrounding the gate,
   wherein the gate does not include spacers and the ILD is in direct contact with the high-k dielectric layer, and
   wherein a top surface of the un-doped channel region is co-planar with a top surface of the channel layer, and a bottom surface of the un-doped channel region is below a top surface of the substrate.

9. The device according to claim 8, wherein the substrate has a band gap offset against the channel layer.

10. The device according to claim 8, wherein the substrate is silicon (Si) and the channel layer is epitaxial doped-Si.

11. The device according to claim 8, further comprising:
    contact holes on opposite sides of the gate extending through the ILD to the channel layer; and
    source/drain contacts within the channel layer.

12. A method comprising:
    forming a channel layer above a substrate, wherein the substrate has a band gap offset against the channel layer;
    forming a dummy gate on the channel layer;
    forming an interlayer dielectric (ILD) on the channel layer being contiguous with and surrounding the dummy gate;
    forming a trench within the ILD, the channel layer, and at least part of the substrate by removing the dummy gate, the channel layer below the dummy gate, and a portion of the substrate below the dummy gate;
    forming an un-doped channel region at the bottom of the trench by epitaxial growth;
    conformally forming a high-k dielectric layer within the trench after forming the un-doped channel region; and
    filling the trench with a metal to form a gate,
    wherein the gate does not include spacers and the ILD is in direct contact with the high-k dielectric layer.

13. The method according to claim 12, further comprising:
    forming contact holes in the ILD on opposite sides of the high-k dielectric layer; and
    forming source/drain contacts within the channel layer below the contact holes.

14. The method according to claim 12, comprising forming the channel layer of doped silicon (Si) and the substrate of Si.

* * * * *